(12) United States Patent
Lemke et al.

(10) Patent No.: US 11,139,263 B2
(45) Date of Patent: Oct. 5, 2021

(54) SEMICONDUCTOR DEVICE

(71) Applicant: VOLKSWAGEN AKTIENGESELLSCHAFT, Wolfsburg (DE)

(72) Inventors: Andreas Lemke, Ummendorf (DE); Marcus Klink, Salzgitter (DE); Bastian Schaar, Braunschweig (DE); Werner Rössler, Neufahrn (DE); Frank Wesche, Velpke (DE); Henning Volkmar, Isenbüttel (DE); Lutz Lackenmacher, Rötgesbüttel (DE); Bastian Gröger, Grasleben (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 0 days.

(21) Appl. No.: 16/847,314

(22) Filed: Apr. 13, 2020

(65) Prior Publication Data
US 2020/0328179 A1 Oct. 15, 2020

(30) Foreign Application Priority Data
Apr. 15, 2019 (DE) ...................... 10 2019 205 411.0

(51) Int. Cl.
*H01L 23/00* (2006.01)
*H01L 25/07* (2006.01)
*H01L 23/498* (2006.01)
*H01L 23/367* (2006.01)

(52) U.S. Cl.
CPC .......... *H01L 24/72* (2013.01); *H01L 23/3672* (2013.01); *H01L 23/49844* (2013.01); *H01L 25/072* (2013.01)

(58) Field of Classification Search
CPC ....................................................... H01L 24/72
USPC ........................................................... 257/40
See application file for complete search history.

(56) References Cited

U.S. PATENT DOCUMENTS

| 3,955,122 A * | 5/1976 | Maynard ............... H01L 23/467 361/710 |
|---|---|---|
| 5,363,552 A | 11/1994 | Coniff |
| 6,833,997 B1 | 12/2004 | Jones, III et al. |
| 2004/0212963 A1 | 10/2004 | Unrein et al. |
| 2005/0128713 A1 | 6/2005 | Schmidberger |

FOREIGN PATENT DOCUMENTS

| DE | 10016306 A1 * | 10/2001 | .......... H01L 23/051 |
|---|---|---|---|
| DE | 603 19 523 T2 | 3/2009 | |
| EP | 0 130 279 B1 | 3/1989 | |

* cited by examiner

*Primary Examiner* — Ajay Arora
(74) *Attorney, Agent, or Firm* — Pearl Cohen Zedek Latzer Baratz LLP

(57) ABSTRACT

A semiconductor device comprising at least a semiconductor component, a heat sink, a connecting element and an electrical circuit connected to the heat sink in an electrically conductive manner; wherein the semiconductor component and the heat sink are arranged at a distance from one another and are electrically and thermally conductively connected via the connecting element, wherein an electrical current can be supplied to the electrical circuit via the heat sink.

12 Claims, 4 Drawing Sheets

SEMICONDUCTOR DEVICE

CROSS-REFERENCE TO RELATED APPLICATION

This application claims priority to German Patent Application No. 10 2019 205 411.0, filed Apr. 15, 2019, which is hereby incorporated by reference in its entirety.

FIELD OF THE INVENTION

The invention relates to a semiconductor device, comprising at least a semiconductor component. The semiconductor component is in particular arranged on a printed circuit board and connected to it in an electrically conductive manner.

Semiconductor devices regularly comprise a plurality of semiconductor components which are arranged together on a printed circuit board. The printed circuit board realizes electrical contacting of the semiconductor elements with an electrical circuit.

Semiconductor devices have to be cooled regularly. The heat generated in the semiconductor components is to be dissipated in particular via cooling elements (heat sinks), wherein the heat sinks have for example a much larger surface area than the semiconductor components.

It is for example known to use massive components (for example cuboids made of aluminum) as heat sinks. These are in contact with semiconductor components via a base area of the semiconductor component. A plurality of semiconductor components are usually arranged together on a printed circuit board. Semiconductor components regularly have different thicknesses from one another, so that semiconductor components which are arranged on the printed circuit board with a first base area each have second base areas arranged differently from the printed circuit board.

A heat radiation arrangement having a shielding housing for protecting electronic components is known from EP 0 130 279 B1. A first cooling element is thermally conductively connected to the housing and a second cooling element to the component. The cooling elements are thermally conductively connected to each other via a thread. The second cooling element can be displaced relative to the first cooling element and the housing towards the component via the thread, so that contacting is ensured.

An apparatus for cooling semiconductor components is known from DE 603 19 523 T2. The semiconductor element is thermally conductively connected to a cooling element via an elastically deformable spring element.

From US 2004/0212963 A1, springs are also provided for the thermally conductive connection of a printed circuit board to a heat sink.

The object of the present invention is to at least partially solve the problems mentioned with reference to the prior art. In particular, a semiconductor device is to be proposed that allows a particularly advantageous electrical connection of the semiconductor components and thereby ensures reliable contacting of the semiconductor components with a heat sink.

SUMMARY OF THE INVENTION

A semiconductor device with the features according to claim 1 contributes to solving these problems. Advantageous further developments are the subject matter of the dependent claims. The features listed individually in the claims can be combined with one another in a technologically sensible manner and can be supplemented by explanatory facts from the description and/or details from the figures, further embodiment variants of the invention being shown.

A semiconductor device is proposed, comprising (at least) one semiconductor component, one heat sink and one connecting element and one electrical circuit which is connected to the heat sink in an electrically conductive manner. The semiconductor component and the heat sink are arranged at a distance from one another and are electrically and thermally conductively connected to one another via the connecting element. An electrical current can be passed on to the electrical circuit via the heat sink.

The electrical circuit comprises at least one electrical line via which the heat sink can be connected or is connected to a voltage source.

During the operation of the semiconductor device, on the one hand an electrical current and on the other hand heat generated in the semiconductor component is dissipated to the heat sink via the connecting element arranged between the heat sink and the semiconductor component. In particular, a distance (which can be of different sizes for a plurality of semiconductor components arranged on a common printed circuit board) between the semiconductor component and the heat sink is bridged via the connecting element.

The heat sink is used in the operation of the semiconductor device, in particular for the transmission of an electrical current.

In particular, the connecting element for bridging the distance is at least partially deformable (e.g. plastically, that is to say permanently, that is to say not independently deformable).

The connecting element is preferably at least partially elastically deformable. An elastic deformation allows the connecting element to be elastically recovered. Furthermore, a prestress in the connecting element can be set due to the elastic properties, so that contacting of the heat sink and/or the semiconductor component (even without a positive or material connection) can be ensured.

In particular, there is a contacting at least between the connecting element and the semiconductor component or between the connecting element and the heat sink (preferably between the two) exclusively via a clamping action as a result of the elastic deformation of the connecting element. In particular, the connecting element is prestressed via the elastic deformation, so that a clamping force acting between the connecting element and the semiconductor component or heat sink (or between the semiconductor component and heat sink) is realized.

In particular, (optionally as an alternative or in addition to the semiconductor component), the connecting element is at least connected in a material-locking manner to the heat sink (for example via a welded connection, a soldered connection, or generally via bonding).

The connecting element is preferably a sheet metal part, in particular a stamped part.

In particular, the semiconductor component is arranged on a printed circuit board, a first base area of the semiconductor component facing the printed circuit board and a second base area opposite the first base area facing the heat sink.

In particular, the semiconductor component is cuboid in shape, the base areas forming the largest side areas.

In particular, an electrical first connector of the semiconductor component is arranged on the second base area.

In particular, the connecting element contacts the semiconductor component at least at the first connector. The semiconductor component and the heat sink, or the circuit connected to the heat sink, are connected to one another via the first connector in an electrically conductive manner.

An electrical current or an electrical voltage can thus be applied to the semiconductor component via the second base area, and thus in a particularly simple manner via the heat sink.

The semiconductor component preferably comprises at least one transistor (possibly a plurality of transistors or electrical circuits comprising transistors), the first connector being a drain connector.

A transistor has in particular a first connector (drain), a second connector (source) and a third connector (gate). An electrical current between source and drain can be set (in particular controllably) via a voltage present between the gate and source.

It is proposed here that the drain connector is arranged on the second base area of the semiconductor component. The heat sink can thus be used as a current conductor on the one hand and at the same time for dissipating heat.

In particular, a plurality of semiconductor components are arranged on the printed circuit board, the second base areas of at least two semiconductor components being arranged at a different distance from the heat sink (for example because of different thicknesses of the semiconductor components). Each of the second base areas is electrically and thermally conductively connected to the heat sink via the one connecting element.

In particular, a first semiconductor component is arranged at a first distance and a second semiconductor component is arranged at a second distance from the heat sink. The first distance and the second distance can differ in particular in the order of magnitude of at least 10 or at least 100 up to a plurality of hundred micrometers.

The connecting element for connecting a semiconductor component to the heat sink each preferably has a spring segment which, when arranged between the semiconductor component and the heat sink, is (substantially) elastically deformable independently of other spring segments of the connecting element.

In particular, each spring segment can bridge the (first or second) distance present between the respective semiconductor component and the (common) heat sink.

As a precaution, it should be noted that the numerals used here ("first," "second," . . . ) serve primarily (only) to differentiate between a plurality of similar objects or sizes, in particular, therefore, do not necessarily prescribe any dependency and/or sequence of these objects or sizes to one another. Should a dependency and/or sequence be necessary, this is explicitly stated here or it is evident for the person skilled in the art to study the specifically described configuration. If a component can occur more than once ("at least one"), the description of one of these components can apply equally to all or part of the majority of these components, but this is not mandatory.

BRIEF DESCRIPTION OF THE DRAWINGS

The invention and the technical environment are explained in more detail below with reference to the accompanying figures. It should be pointed out that the invention is not intended to be limited by the exemplary embodiments mentioned. In particular, unless explicitly stated otherwise, it is also possible to extract partial aspects of the facts explained in the figures and to combine them with other components and findings from the present description. In particular, it should be pointed out that the figures and in particular the proportions shown are only schematic. In the drawings.

DETAILED DESCRIPTION OF THE INVENTION

Figure 1:
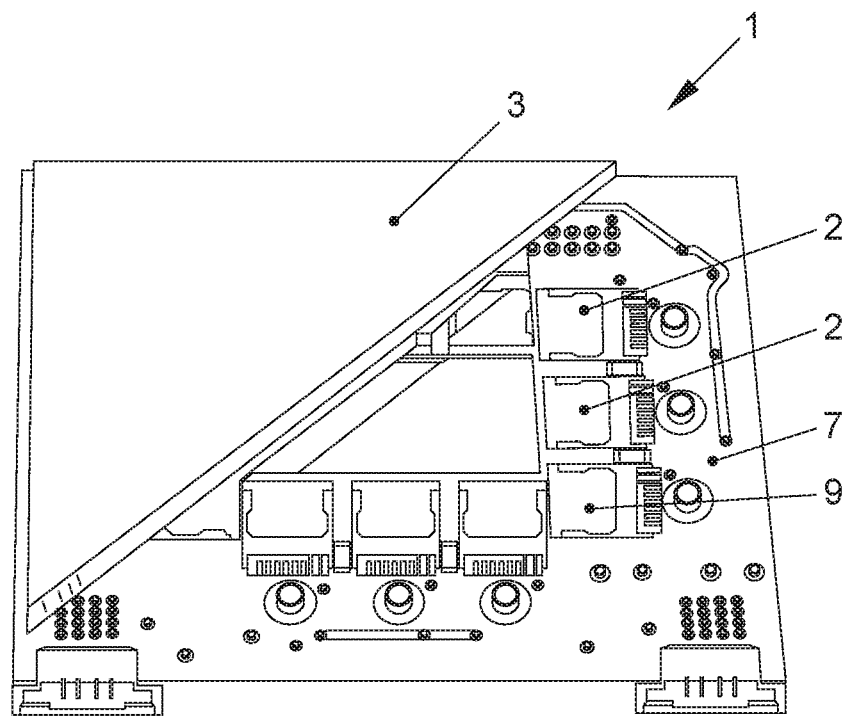
FIG. 1: shows a semiconductor device having direct contacting of the heat sink and semiconductor components; in a perspective view.
Figure 2:
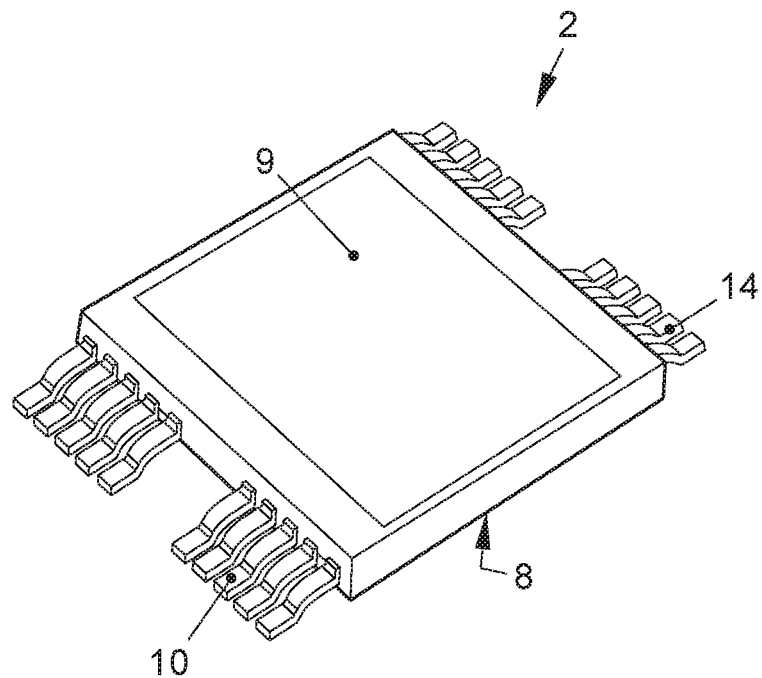
FIG. 2: shows a known semiconductor component for arrangement in a semiconductor device, in a perspective view.
Figure 3:
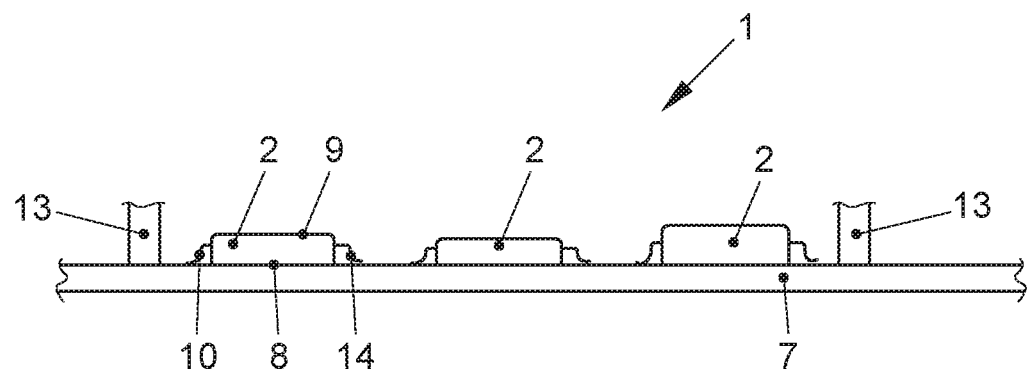
FIG. 3: shows a part of a semiconductor device, comprising a printed circuit board and a plurality of semiconductor components in a side view.
Figure 4:
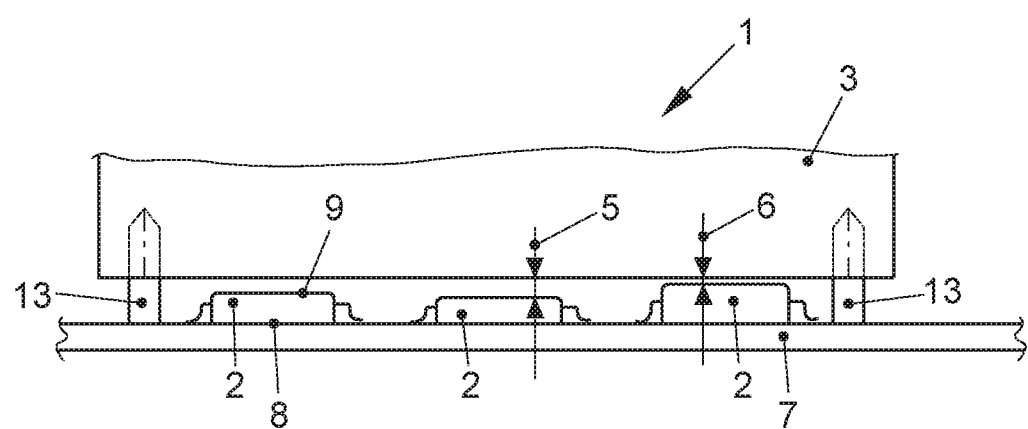
FIG. 4: shows the semiconductor device according to FIGS. 1 and 3.

FIG. 1 shows a semiconductor device 1 with direct contacting of the heat sink 3 and the semiconductor components 2; in a perspective view. FIG. 2 shows a known semiconductor component 2 for arrangement in a semiconductor device 1, in a perspective view. FIG. 3 shows part of a semiconductor device 1, comprising a printed circuit board 7 and a plurality of semiconductor components 2 in a side view. FIG. 4 shows the semiconductor device 1 according to FIGS. 1 and 3. FIGS. 1 to 4 are described together below.

The semiconductor device 1 comprises a plurality of semiconductor components 2 arranged on a printed circuit board 7 and a heat sink 3. The semiconductor components 2 and the heat sink 3 are arranged directly adjacent to one another, so that contacting of the semiconductor components and the heat sink 3 is preferably realized.

The semiconductor components 2 are arranged on a printed circuit board 7, a first base area 8 of the semiconductor components 2 facing the printed circuit board 7 and a second base area 9 opposite the first base area 8 facing the heat sink 3. The heat sink 3 is arranged via guides 13 in relation to the printed circuit board 7 and the semiconductor components 2.

The semiconductor components 2 are cuboid in shape, the base areas 8, 9 forming the largest side surfaces.

It can be seen in FIGS. 3 and 4 that the second base areas 9 of different semiconductor components 2 are arranged at a different distance 5, 6 from the heat sink 3 (here due to different thicknesses of the semiconductor components 2). A (first) semiconductor component 2 is arranged at a first distance 5 and a (second) semiconductor component 2 at a second distance 6 from the heat sink 3.

Figure 5:
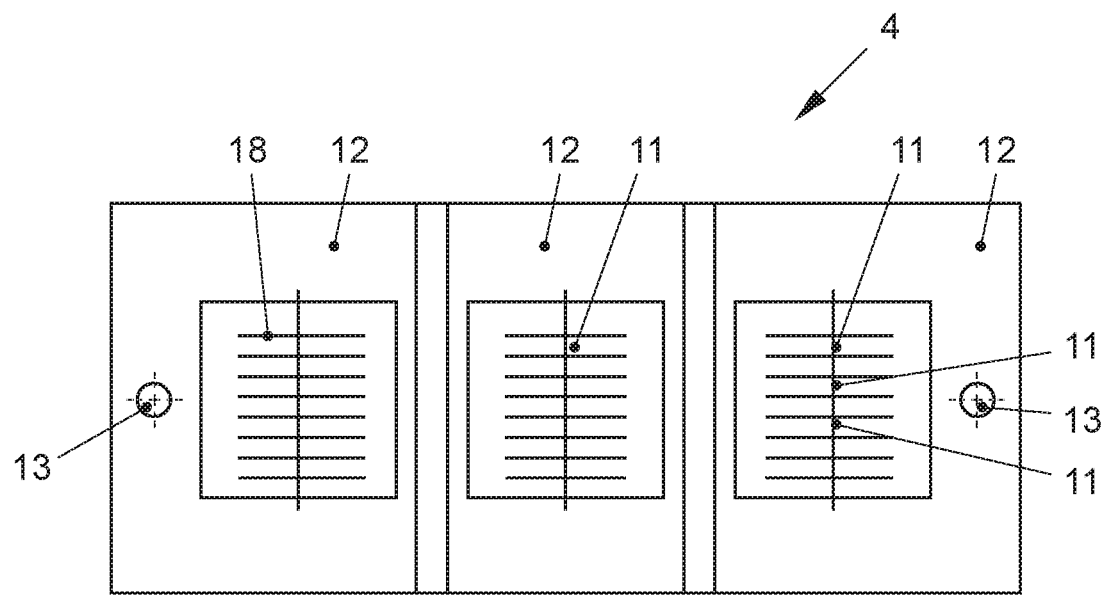
FIG. 5: shows a connecting element in a plan view.
Figure 6:
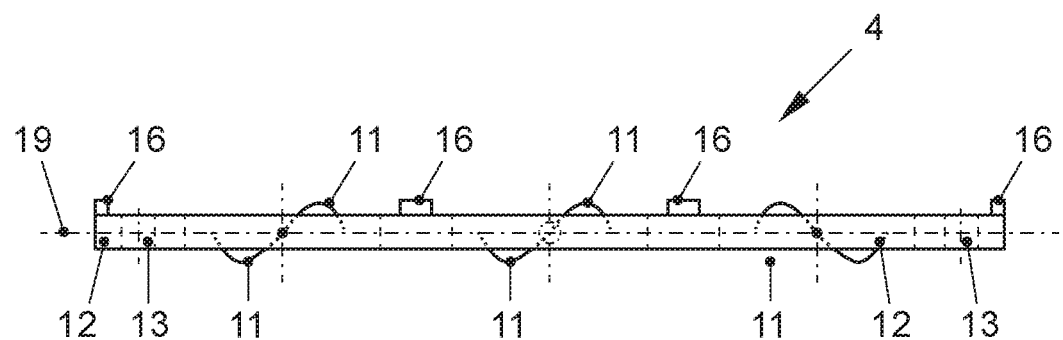
FIG. 6: shows the connecting element of FIG. 5 in a side view.
Figure 7:
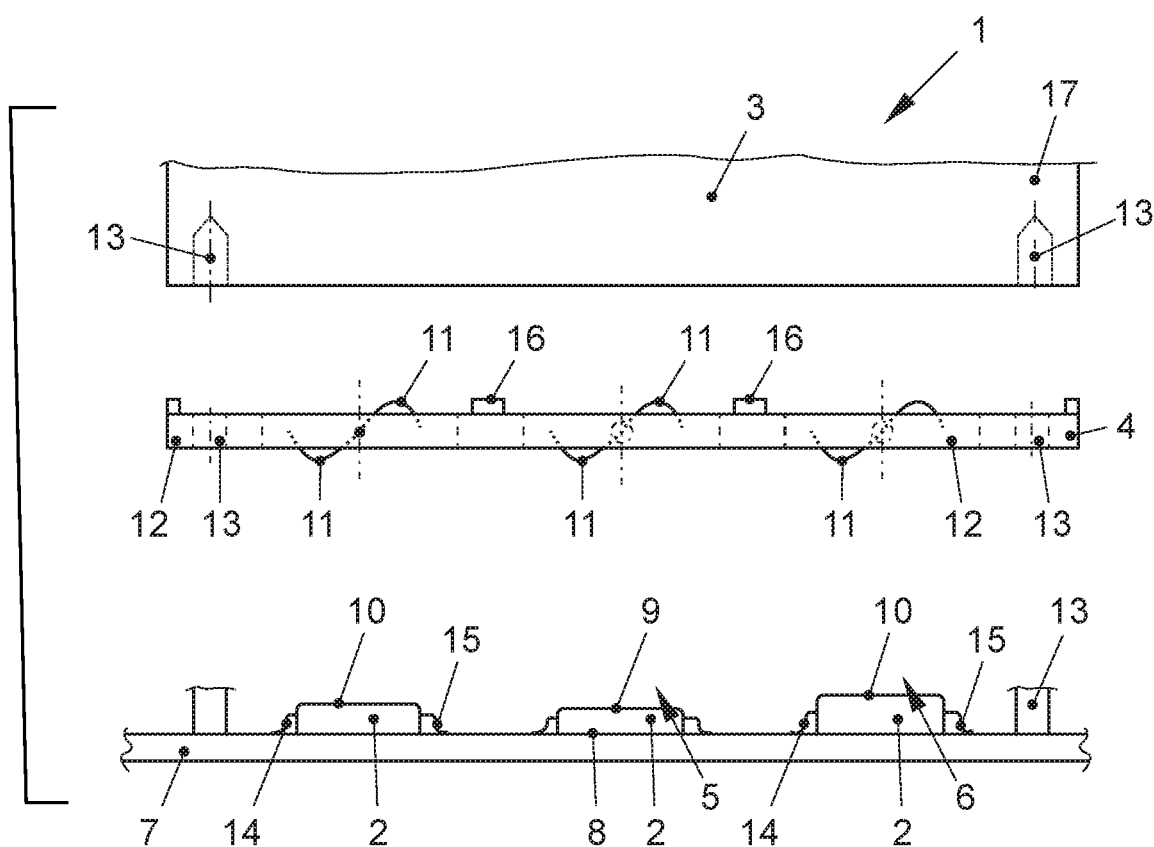
FIG. 7: shows a semiconductor device having the connecting element.

FIG. 5 shows a connecting element 4 in a plan view. FIG. 6 shows the connecting element 4 according to FIG. 5 in a side view. FIG. 7 shows a semiconductor device 1 with the connecting element 4 according to FIGS. 5 and 6. FIGS. 5 to 7 are described together below. Reference is made to the embodiments to the FIGS. 1 to 4.

The semiconductor device 1 comprises a plurality of semiconductor components 2 arranged on a printed circuit board 7, a heat sink 3 as well as a connecting element 4 and an electrical circuit 17 which is connected in an electrically conductive manner to the heat sink 3. The semiconductor components 2 and the heat sink 3 are arranged at mutually different distances 5, 6 and are electrically and thermally conductively connected to one another via the connecting element 4. An electrical current can be passed on to the electrical circuit 17 via the heat sink 3.

The electrical circuit 17 comprises an electrical line, via which the heat sink 3 can be connected or is connected to a voltage source (not shown here).

Via the connecting element 4 arranged between the heat sink 3 and the semiconductor components 2, an electrical current is dissipated on the one hand during operation of the semiconductor device 1 and on the other hand heat generated in the semiconductor components 2 is dissipated to the heat sink 3. Different distances 5, 6 between the semiconductor components 2 and the heat sink 3 are bridged via the connecting element 4.

The semiconductor components 2 are arranged on a printed circuit board 7, a first base area 8 of the semiconductor components 2 facing the printed circuit board 7 and a second base area 9 opposite the first base area 8 facing the heat sink 3. The semiconductor components 2 are cuboid in shape, the base areas 8, 9 forming the largest side surfaces. An electrical first connector 10 of the semiconductor components 2 is arranged on the second base area 9.

The connecting element 4 contacts the semiconductor component 2 at least at the first connector 10. Via the first connector 10, each semiconductor component 2 is connected to the one-piece heat sink 3 or to the circuit 17 in an electrically conductive manner.

The semiconductor components 2 comprise at least one transistor (possibly a plurality of transistors or electrical circuits comprising transistors), the first connector 10 being a drain connector.

The transistors each have a first connector 10 (drain), a second connector 14 (source) and a third connector 15 (gate).

The connecting element 4 is here a sheet metal part or a stamped part. The connecting element 4 each has a spring segment 11 for connecting a semiconductor component 2 to the heat sink 3, which, when arranged between the semiconductor component 2 and the heat sink 3 is (substantially) elastically deformable independently of other spring segments 11 of the connecting element 4. The first distance 5 or second distance 6 present between the respective semiconductor component 2 and the common heat sink 3 is bridged by each spring segment 11.

The spring segments 11 are spaced apart from one another by means of stamped lines 18 (FIG. 5) and are therefore substantially independently deformable. Starting from a middle plane 19, each spring segment 11 is deformed towards the heat sink 3 on the one hand and towards the semiconductor component 2 on the other hand (see FIG. 6), so that spring segment parts of each spring segment 11 extend from the middle plane 19 to each side of the middle plane 19.

The spring segments 11 are arranged within a (fixed, undeformed, i.e. flat) frame 12. The frame 12 has guides 13 so that the frame 12 and thus the spring segments 11 can be arranged aligned with the printed circuit board 7 (and with the heat sink 3).

Spacers 16 are arranged on the connecting element 4, so that an elastic deformation of the spring segments 11 (which are different from each other) is possible and thus a different distance 5, 6 (also possibly between the heat sink 3 and the connecting element 4) can be compensated.

LIST OF REFERENCE NUMERALS 1 semiconductor device
2 semiconductor component
3 heat sink
4 connecting element
5 first distance
6 second distance
7 printed circuit board
8 first base area
9 second base area
10 first connector
11 spring segment
12 frame
13 guide
14 second connector
15 third connector
16 spacers
17 circuit
18 stamped line
19 middle plane

The invention claimed is:

1. A semiconductor device, comprising:
a semiconductor component,
a heat sink, a connecting element, and
an electrical circuit connected to the heat sink in an electrically conductive manner;
wherein the semiconductor component and the heat sink are separated a distance from one another and are electrically and thermally conductively connected via the connecting element which bridges the distance between the semiconductor component and the heat sink, wherein an electrical current can be supplied to the electrical circuit via the heat sink.

2. The semiconductor device according to claim 1, wherein the connecting element which bridges the distance between the semiconductor component and the heat sink is at least partially deformable.

3. The semiconductor device according to claim 2, wherein the connecting element is at least partially elastically deformable.

4. The semiconductor device according to claim 3, wherein a contacting is made at least between the connecting element and the semiconductor component or between the connecting element and the heat sink exclusively via a clamping action as a result of the elastic deformation of the connecting element.

5. The semiconductor device according to claim 1, wherein the connecting element is at least integrally connected to the heat sink.

6. The semiconductor device according to claim 5, wherein the semiconductor component comprises at least one transistor, wherein the first connector is a drain connector.

7. The semiconductor device according to claim 1, wherein the connecting element is a sheet metal part.

8. The semiconductor device according to claim 7, wherein the semiconductor component comprises at least one transistor, wherein the first connector is a drain connector.

9. The semiconductor device according to claim 1, wherein the semiconductor component is arranged on a printed circuit board, wherein a first base area of the semiconductor component faces the printed circuit board, and a second base area opposite the first base area faces the heat sink.

10. The semiconductor device according to claim 9, further comprising an electrical first connector of the semiconductor component being arranged on the second base area.

11. The semiconductor device according to claim 9, wherein a plurality of semiconductor components is arranged on the printed circuit board, and wherein the second base areas of at least two semiconductor components are arranged at a different distance from one another to the heat sink, each of the second base areas being electrically and thermally conductively connected to the heat sink via the one connecting element.

12. The semiconductor device according to claim 11, wherein the connecting element for connecting a respective semiconductor component to the heat sink each has a spring segment which is elastically deformable independently of other spring segments of the connecting element in the arrangement between the semiconductor component and the heat sink.

* * * * *